(12) United States Patent
Utsumi et al.

(10) Patent No.: US 12,274,114 B2
(45) Date of Patent: Apr. 8, 2025

(54) DISPLAY DEVICE INCLUDING METAL OXIDE NANOPARTICLES FOR UNIFORM AND EFFICIENT LIGHTING AND METHOD FOR PRODUCING SAME

(71) Applicant: SHARP KABUSHIKI KAISHA, Sakai (JP)

(72) Inventors: Hisayuki Utsumi, Sakai (JP); Masayuki Kanehiro, Sakai (JP); Youhei Nakanishi, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 489 days.

(21) Appl. No.: 17/635,970

(22) PCT Filed: Sep. 6, 2019

(86) PCT No.: PCT/JP2019/035276
§ 371 (c)(1),
(2) Date: Feb. 16, 2022

(87) PCT Pub. No.: WO2021/044634
PCT Pub. Date: Mar. 11, 2021

(65) Prior Publication Data
US 2022/0293881 A1 Sep. 15, 2022

(51) Int. Cl.
*H10K 50/16* (2023.01)
*H10K 50/115* (2023.01)
(Continued)

(52) U.S. Cl.
CPC .......... *H10K 50/16* (2023.02); *H10K 50/115* (2023.02); *H10K 50/841* (2023.02); *H10K 59/12* (2023.02);
(Continued)

(58) Field of Classification Search
CPC ........ H10K 50/16; H10K 71/00; H10K 85/60; H10K 50/115; H10K 2102/00;
(Continued)

(56) References Cited

U.S. PATENT DOCUMENTS 5,698,740 A * 12/1997 Enokida ............. H10K 85/6565
548/440
9,559,327 B2 * 1/2017 Yoneda .................. H10K 50/16
(Continued)

FOREIGN PATENT DOCUMENTS

| CN | 106340532 A | 1/2017 |
| CN | 107099190 A | 8/2017 |

(Continued)

*Primary Examiner* — Caleb E Henry
(74) *Attorney, Agent, or Firm* — ScienBiziP, P.C.

(57) ABSTRACT

A display device comprises: a display region having a plurality of pixels; and a frame region, the display region including: a thin-film transistor layer; a light-emitting-element layer provided above the thin-film transistor layer; and a sealing layer provided above the light-emitting-element layer, the light-emitting-element layer including: a first electrode; a second electrode; a light-emitting layer provided between the first electrode and the second electrode; and an electron-transport layer provided between the light-emitting layer and the second electrode, and the electron-transport layer containing: nanoparticles of metal oxide; and a binding resin.

18 Claims, 6 Drawing Sheets

(51) Int. Cl.
  *H10K 50/84* (2023.01)
  *H10K 59/12* (2023.01)
  *H10K 71/00* (2023.01)
  *H10K 102/00* (2023.01)
  *H10K 102/10* (2023.01)

(52) U.S. Cl.
  CPC ......... *H10K 71/00* (2023.02); *H10K 59/1201* (2023.02); *H10K 2102/101* (2023.02); *H10K 2102/331* (2023.02)

(58) Field of Classification Search
  CPC .. H10K 2102/331; H10K 71/12; H10K 50/15; H10K 50/841; H10K 59/12; H10K 59/1201; H10K 2102/101; H10K 59/131; H10K 85/636; C09K 11/883; C09K 11/02; G09F 9/30; H05B 33/10; H05B 33/12; H05B 33/14
  See application file for complete search history.

(56) References Cited

U.S. PATENT DOCUMENTS

| | | | | |
|---|---|---|---|---|
| 9,564,609 | B2 * | 2/2017 | Sasaki | H10K 50/818 |
| 9,577,206 | B2 * | 2/2017 | Yamae | H10K 50/131 |
| 9,647,228 | B2 * | 5/2017 | Seo | H10K 50/19 |
| 9,653,517 | B2 * | 5/2017 | Uesaka | H10K 59/32 |
| 9,812,514 | B2 * | 11/2017 | Liu | H10K 50/182 |
| 10,522,775 | B2 * | 12/2019 | Tsukamoto | H10K 71/00 |
| 10,826,010 | B1 * | 11/2020 | Montgomery | H10K 59/35 |
| 2002/0189542 | A1 * | 12/2002 | Van Slyke | C23C 14/12 |
| | | | | 118/712 |
| 2003/0211651 | A1 * | 11/2003 | Krasnov | C09K 11/883 |
| | | | | 438/102 |
| 2005/0098207 | A1 * | 5/2005 | Matsumoto | H10K 50/165 |
| | | | | 313/506 |
| 2008/0264475 | A1 * | 10/2008 | Ito | H01G 9/2004 |
| | | | | 136/252 |
| 2009/0243473 | A1 * | 10/2009 | Iwakuma | H10K 50/14 |
| | | | | 313/504 |
| 2010/0283046 | A1 * | 11/2010 | Uchida | B82Y 20/00 |
| | | | | 257/E51.027 |
| 2012/0086331 | A1 * | 4/2012 | Kobayashi | H10K 71/164 |
| | | | | 313/504 |
| 2014/0084280 | A1 * | 3/2014 | Chiba | H10K 50/16 |
| | | | | 438/46 |
| 2014/0197387 | A1 * | 7/2014 | Miyao | C08J 5/005 |
| | | | | 524/600 |
| 2016/0088756 | A1 * | 3/2016 | Ramadas | C08J 7/048 |
| | | | | 361/728 |
| 2016/0150619 | A1 * | 5/2016 | Krummacher | H05B 45/60 |
| | | | | 315/224 |
| 2016/0233449 | A1 * | 8/2016 | Murayama | C09K 11/565 |
| 2017/0012231 | A1 * | 1/2017 | Mishima | H10K 77/111 |
| 2018/0062101 | A1 * | 3/2018 | Li | H10K 50/11 |
| 2018/0069071 | A1 * | 3/2018 | Furuie | H10K 77/111 |
| 2018/0254421 | A1 * | 9/2018 | Kinge | H10K 30/35 |
| 2019/0112491 | A1 * | 4/2019 | Mei | H10K 85/381 |
| 2020/0266348 | A1 * | 8/2020 | Kim | C09K 11/025 |
| 2020/0320959 | A1 * | 10/2020 | Ryu | G09G 3/3275 |
| 2020/0321490 | A1 * | 10/2020 | Yang | B82Y 20/00 |
| 2020/0321546 | A1 * | 10/2020 | He | H10K 71/00 |
| 2020/0328380 | A1 * | 10/2020 | Benzie | H10K 71/00 |
| 2020/0411719 | A1 * | 12/2020 | Kimoto | H01L 31/035218 |
| 2021/0257570 | A1 * | 8/2021 | Sugimura | H10K 85/221 |

FOREIGN PATENT DOCUMENTS

| | | |
|---|---|---|
| JP | 2016-113538 A | 6/2016 |
| JP | 2016-526251 A | 9/2016 |
| KR | 10-2015-0121355 A | 10/2015 |
| WO | 2012/160714 A1 | 11/2012 |

* cited by examiner

DISPLAY DEVICE INCLUDING METAL OXIDE NANOPARTICLES FOR UNIFORM AND EFFICIENT LIGHTING AND METHOD FOR PRODUCING SAME

TECHNICAL FIELD

The disclosure relates to a display device and a method for producing the display device.

BACKGROUND ART

FIG. 6 illustrates a multilayered structure of a main part of a light-emitting element in a known display device. FIG. 7 schematically illustrates a structure of an electron-transport layer 124c above a light-emitting layer 124b of the display device in FIG. 6. As illustrated in FIG. 6, the display device, which includes the light-emitting element, includes the electron-transport layer (hereinafter also referred to as an ETL) 124c between the light-emitting layer 124b and a second electrode 125. In forming the ETL 124c, as illustrated in FIG. 7, nanoparticles NP of metal oxide are dispersed into a solvent so that a fluid disperse is prepared. The fluid disperse is applied by spin-coating (with a spin coater) to form the ETL 124c.

CITATION LIST

Patent Literature

[Patent Document 1] Japanese Unexamined Patent Application Publication (Translation of PCT Application) No. 2016-526251 (published on Sep. 1, 2016).

SUMMARY

Technical Problems

The nanoparticles NP are small, and are more likely to agglomerate and less likely to disperse. Because of this problem, the ETL 124c cannot be stably formed by spin-coating of the fluid disperse. Hence, as illustrated in FIG. 7, the formed ETL 124c is neither uniform nor planar. The resulting ETL 124c exhibits unbalanced motion of electrons, and is highly likely to emit light unevenly.

Note that, for example, Patent Document 1 discloses an encapsulation barrier stack comprising nanoparticles encapsulated in dendrimers.

However, in the nanoparticle-containing layer described in Patent Document 1, the dendrimers are an insulator. Thus, the nanoparticles encapsulated in the dendrimers cannot provide or receive electrons. That is, the nanoparticle-containing layer described in Patent Document 1 cannot be used as an ETL. Moreover, the nanoparticle-containing layer described in Patent Document 1 serves as a barrier against water and oxygen by packing; however, the layer is vulnerable to such damage as heat and plasma.

In view of the above problems, an aspect of the disclosure is intended to provide a display device that emits light evenly and efficiently, and a method for producing the display device.

Solution to Problems

In order to solve the above problems, a display device according to an aspect of the disclosure includes: a display region having a plurality of pixels; and a frame region. The display region includes: a thin-film transistor layer; a light-emitting-element layer provided above the thin-film transistor layer; and a sealing layer provided above the light-emitting-element layer. The light-emitting-element layer including: a first electrode; a second electrode; a light-emitting layer provided between the first electrode and the second electrode; and an electron-transport layer provided between the light-emitting layer and the second electrode. The electron-transport layer containing: nanoparticles of metal oxide; and a binding resin.

Moreover, in order to solve the above problems, a method for producing a display device is directed to a display device including: a display region having a plurality of pixels; and a frame region. The display region includes: a thin-film transistor layer; a light-emitting-element layer provided above the thin-film transistor layer; and a sealing layer provided above the light-emitting-element layer. The light-emitting-element layer includes: a first electrode; a second electrode; a light-emitting layer provided between the first electrode and the second electrode; and an electron-transport layer provided between the light-emitting layer and the second electrode. The method includes: forming an electron-transport layer on the light-emitting layer. The forming of the electron-transport layer includes: mixing nanoparticles and a binding resin together; dissolving the mixture of the nanoparticles and the binding resin in a solvent to prepare a solution; applying the solution to the light-emitting layer; and removing the solvent contained in the solution.

Advantageous Effects

An aspect of the disclosure can provide a display device that emits light evenly and efficiently, and a method for producing the display device.

DESCRIPTION OF EMBODIMENTS

First Embodiment

Described below in detail is an embodiment of the disclosure.

Display Device

Figure 1:
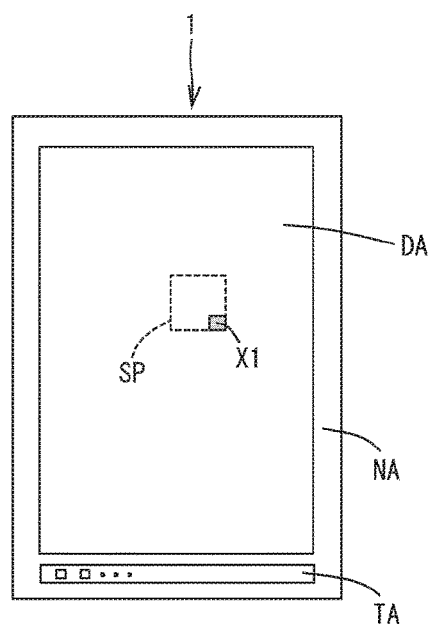
FIG. 1 illustrates a schematic plan view of a configuration of a display device according to a first embodiment of the disclosure.
Figure 2:
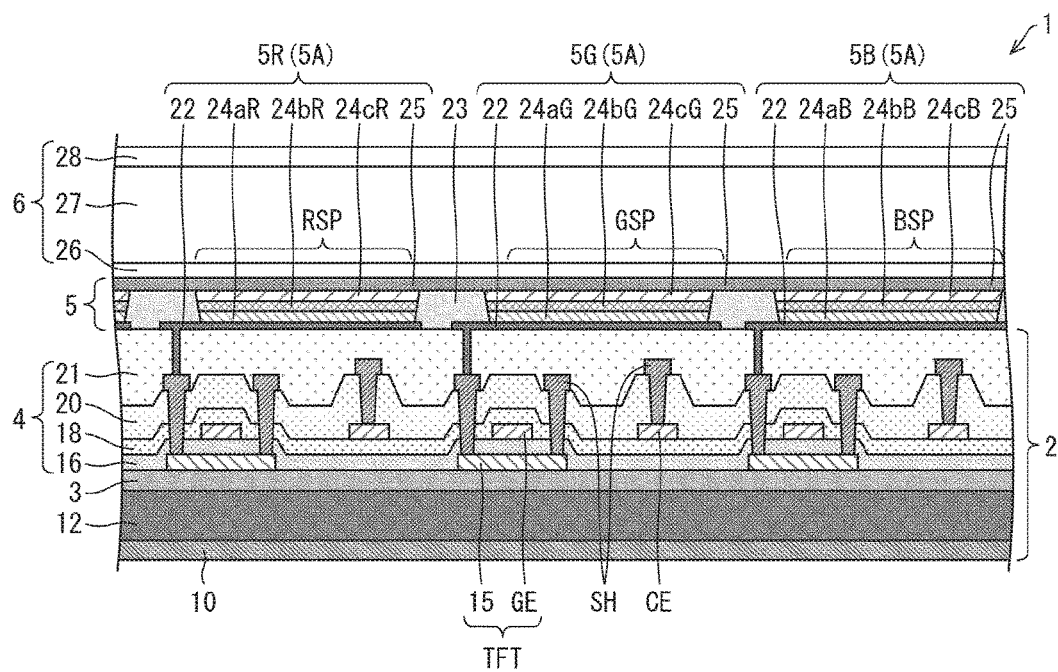
FIG. 2 illustrates a cross-sectional view of a configuration of the display device according to the first embodiment of the disclosure.

Described below is an exemplary case where the display device according to this embodiment is a quantum-dot light-emitting diode (QLED) display including QLEDs as light-emitting elements. FIG. 1 illustrates a schematic plan view of a configuration of a display device 1 according to this embodiment. FIG. 2 illustrates a cross-sectional view of a configuration of the display device 1.

As illustrated in FIG. 1, the display device 1 includes: a display region DA having a plurality of pixels; and a frame region NA surrounding the display region DA. The frame region NA is provided with a terminal unit TA. As illustrated in FIG. 2, the display device 1 includes: an array substrate 2; a QLED layer 5 stacked above the array substrate 2 and serving as a light-emitting-element layer; and a sealing layer 6 covering the QLED layer 5. The array substrate 2 includes, for example: a lower-face film 10; a resin layer 12; a barrier layer 3; and a thin-film-transistor layer (hereinafter referred to as "TFT layer") 4 serving as a drive element layer.

The display region DA has a plurality of pixels. Formed in the display region DA are a plurality of sub-pixels SP each including a light-emitting element 5A. That is, each of the pixels is a sub-pixel SP.

The lower-face film 10 is attached to a lower face of the resin layer 12 after a support substrate (e.g. mother glass) is removed from the lower face. The lower-face film 10 provides the display device with excellent flexibility. The lower-face film 10 is, for example, a polyethylene terephthalate (PET) film. Note that, the lower-face film 10 and the resin layer 12 may be replaced with a solid substrate such as a glass substrate. An exemplary material of the resin layer 12 includes polyimide. The resin layer 12 may be replaced with either a two-layer resin film (e.g. a polyimide film) or an inorganic insulating film sandwiched in between the two-layer resin film.

The barrier layer (an undercoat layer) 3 is an inorganic insulating layer blocking intrusion of such foreign objects as water and oxygen. The barrier layer 3 can be formed of, for example, silicon nitride and silicon oxide.

The TFT layer 4 includes TFTs. As illustrated in FIG. 2, the TFT layer 4 includes: a semiconductor film 15; an inorganic insulating film 16 (a gate insulating film) above the semiconductor film 15; a gate electrode GE and a gate line above the inorganic insulating film 16; an inorganic insulating film 18 above the gate electrode GE and the gate line GH; a capacitive electrode CE above the inorganic insulating film 18; an inorganic insulating film 20 above the capacitive electrode CE; a line provided above the inorganic insulating film 20 and including a source line SH; and a planarization film 21 (an interlayer insulating film) above the source line SH. Here, each of the TFTs is configured as a drive element to include the semiconductor film 15 and the gate electrode GE.

The semiconductor film 15 is made of, for example, either low-temperature polysilicon (LTPS), or oxide semiconductor. Note that, in FIG. 2, the TFT including the semiconductor film 15 as a channel is of a top gate structure. Alternatively, the TFT may be of a bottom gate structure.

The barrier layer 3 and the inorganic insulating films 16, 18, and 20 can be, for example, a silicon oxide (SiOx) film, or a silicon nitride (SiNx) film formed by the chemical vapor deposition (CVD). Alternatively, the layer and the films can be a multilayer film including these films. The planarization film 21 can be formed of, for example, such an applicable organic material as polyimide and acrylic resin.

The gate electrode GE, the capacitive electrode CE, and such a line as the source line SH are monolayer metal films formed of at least one of such metals as aluminum (Al), tungsten (W), molybdenum (Mo), tantalum (Ta), chromium (Cr), titanium (Ti), and copper (Cu). Alternatively, the electrodes and the line are multilayer metal films including these metals.

The light-emitting-element layer 5 includes a plurality of QLEDs 5A. Each of the QLEDs 5A is formed for a corresponding one of the sub-pixels SP.

Figure 3:
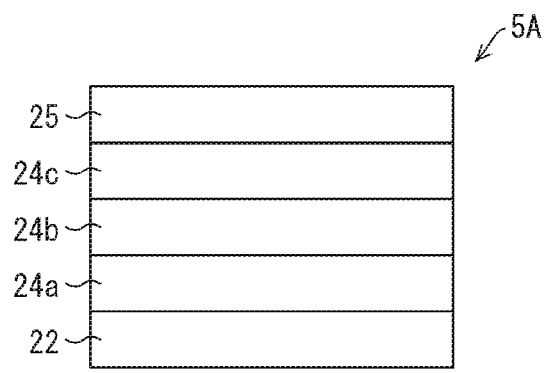
FIG. 3 illustrates a schematic diagram showing an example of a multilayered structure of a light-emitting element corresponding to a sub-pixel of the display device according to the first embodiment of the disclosure.

FIG. 3 illustrates a schematic diagram showing an example of a multilayered structure of a QLED 5A corresponding to a sub-pixel SP of the display device 1 according to this embodiment. As illustrated in FIG. 3, the QLED 5A includes: a first electrode (an anode) 22; a hole-transport layer (hereinafter referred to as an "HTL") 24a; a light-emitting layer 24b; an ETL 24c; and a second electrode (a cathode) 25, all of which are stacked on top of another in the stated order from toward the TFT layer 4.

As illustrated in FIG. 2, the display device 1 includes, as the sub-pixels SP, for example, a sub-pixel RSP (a red sub-pixel) emitting red light, a sub-pixel GSP (a green sub-pixel) emitting green light, and a sub-pixel BSP (a blue sub-pixel) emitting blue light.

The sub-pixel RSP includes, as a QLED, a QLED 5R emitting red light. The sub-pixel GSP includes, as a QLED, a QLED 5G emitting green light. The sub-pixel BSP includes, as a QLED, a QLED 5B emitting blue light.

Here, the red light has a center wavelength in a wavelength band of longer than 600 nm and 780 nm or shorter. The green light has a center wavelength in a wavelength band of longer than 500 nm and 600 nm or shorter. The blue light has a center wavelength in a wavelength band ranging from 400 nm to 500 nm.

As illustrated in FIG. 2, the QLED 5R includes: an HTL 24aR as the HTL 24a; a light-emitting layer 24bR as the light-emitting layer 24b; and an ETL 24cR as the ETL 24c. The QLED 5G includes: an HTL 24aG as the HTL 24a; a light-emitting layer 24bG as the light-emitting layer 24b; and an ETL 24cG as the ETL 24c. The QLED 5B includes: an HTL 24aB as the HTL 24a; a light-emitting layer 24bB as the light-emitting layer 24b; and an ETL 24cB as the ETL 24c.

As illustrated in FIG. 2, the first electrode 22, the HTL 24a, the light-emitting layer 24b, and the ETL 24c in each sub-pixel SP are divided into islands for the respective sub-pixels, using edge covers 23 covering edges of the first electrodes 22. That is, each of the first electrodes 22 is provided for a corresponding one of the sub-pixels. Note that the second electrode 25 is not divided with the edge covers 23, but is formed as a common layer in common among the sub-pixels SP. The edge covers 23 are formed of such an organic material as polyimide and acrylic resin applied and patterned by photolithography. Each of the first electrodes 22 is electrically connected to a corresponding one of the TFTs in the TFT layer 4.

The first electrode 22 and the second electrode 25, containing a conductive material, are respectively and electrically connected to the HTL 24a and the ETL 24c. One of the first electrode 22 or the second electrode 25 is a transparent electrode transparent to light, and the other is a reflective electrode reflecting light. If the display device 1 is a top-emission display device releasing light from toward the second electrode 25, the second electrode 25 is a transparent electrode formed of such a light-transparent conductive material as indium tin oxide (ITO), indium zinc oxide (IZO), aluminum-doped zinc oxide (AZO), or gallium zinc oxide (GZO). Whereas, the first electrode 22 is formed of a multilayer stack including, for example: a layer made of the light-transparent conductive material; and a layer made of either such a metal as aluminum (Al), copper (Cu), gold (Au), or silver (Ag) that highly reflects visible light, or an alloy made of the metals. Note that the display device 1 may be a bottom-emission display device releasing light from toward the first electrode 22. In such a case, the first electrode 22 is a transparent electrode, and the second electrode 25 is a reflective electrode.

The HTL 24a transports holes from the first electrode 22 to the light-emitting layer 24b. The HTL 24a may contain, for example, such inorganic materials as nickel oxide (NiO) and molybdenum trioxide ($MoO_3$). Alternatively, the HTL 24a may contain, for example, such organic materials as poly ethylenedioxythiophene (PEDOT), poly(3,4-ethylene-dioxythiophene)-poly(styrene sulfonate) (PEDOT-PSS), 4-4'-bis[N-phenyl-N-(3"-methylphenyl)amino]biphenyl] (TPD), poly(N-vinylcarbazole) (PVK), poly[(9,9-dioc-tylfluorenyl-2,7-diyl)-co-(4,4'-(N-(4-sec-butylphenyl)di-phenylamine)] (TFB), 4,4'-bis(9-carb azole)-biphenyl) (CBP), and N,N'-di-[(1-naphthyl)-N,N'-diphenyl]-(1,1'-bi-phenyl)-4,4' diamine (NPD). The HTL 24aR, HTL 24aG, and the HTL 24aB may be formed of the same material, or may be formed of different materials with different hole mobility.

The ETL 24c transports electrons from the second electrode 25 to the light-emitting layer 24b. Note that the ETL 24c will be described later in detail.

The light-emitting layer 24b emits light when the holes transported from the first electrode 22 and the electrons transported from the second electrode 25 recombine together. That is, in the display device 1, the holes and the electrons recombine together by a drive current running between the first electrode 22 and the second electrode 25. The recombination of the holes and the electrons forms an exciton. While the exciton transforms from the conduction band level to the valence band level of quantum dots (semiconductor nanoparticles: hereinafter referred to as "QDs"), light is released.

In forming the light-emitting layer 24b, colloidal QDs are dispersed into a solvent of, for example, hexane, toluene, octadecane, cyclododecane, and phenylcyclohexane so that a fluid disperse is produced. The fluid disperse is deposited by spin coating or an inkjet printing for each of the sub-pixels to form the light-emitting layer 24b. Alternately, the light-emitting layer 24b can also be formed by photolithography patterning.

In this embodiment, colored QDs as light emitting materials are included in respective sub-pixels. Specifically, red QDs are included in the light-emitting layer 24bR of the sub-pixel RSP, green QDs are included in the light-emitting layer 24bG of the sub-pixel GSP, and blue QDs are included in the light-emitting layer 24bB of the sub-pixel BSP. Hence, multiple kinds of QDs are included in the light-emitting layer 24b, and a single kind of QDs is included in a single sub-pixel.

Figure 4:
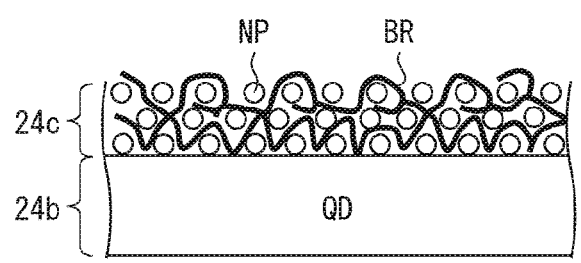
FIG. 4 illustrates a schematic diagram showing a structure of an ELT on a light-emitting layer of the display device according to the first embodiment of the disclosure.

The red QDs, the green QDs, and the blue QDs may contain, for example, a semiconductor material made of at least one kind of element selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). ETL 24c FIG. 4 illustrates a schematic diagram showing a structure of the ELT 24c on the light-emitting layer 24b of the display device 1 according to an embodiment of the disclosure. As illustrated in FIG. 4, the deposited ETL 24c contains nanoparticles NP of metal oxide and a binding resin BR. In the deposited ETL 24c, the binding resin BR flows in the spacing between the nanoparticles NP of metal oxide. That is why the binding resin BR and the nanoparticles NP with improved dispersive property are combined together as the ETL 24c.

The nanoparticles NP of metal oxide; namely, a material of the ETL 24c, are dispersed into a solvent so that a solution is prepared. The solution is applied by spin-coating to form the ETL 24c. In this embodiment, the ETL 24c is formed by a technique including (i) mixing the nanoparticles NP and the binding resin BR, (ii) dissolving the mixture of the nano particles NP and the biding resin BR in a solvent to prepare a solution, (iii) applying the solution to the light-emitting layer 24b with a spin coater, and (iv) drying the solution to remove the solvent and depositing the ETL 24c. In the technique for forming the ETL 24c, the solution may further contain a dispersant dispersing the nanoparticles NP and the binding resin BR from each other.

In the deposited ETL 24c, a volume ratio of the nanoparticles NP and the binding resin BR ranges from 95:5 to 40:60, more preferably from 90:10 to 50:50, and still more preferably from 80:20 to 60:40. The volume ratio ranging from 95:5 to 40:60 can curb the reduction of external quantum efficiency (EQE). A result of EQE due to variation in the volume ratio of the nanoparticles NP to the binding resin BR will be described in detail later in this embodiment.

If the solution to be used for forming the ETL 24c contains the dispersant, the ETL 24c further contains the dispersant dispersing the nanoparticles NP and the binding resin BR from each other.

Note that, in this embodiment, the "nanoparticles" have a weight-average particle size in nanometer (i.e. smaller than 1 µm). The nanoparticles NP have a weight-average particle size ranging from 5 to 20 nm in view of improving characteristics of emitted light.

Examples of the metal oxide include at least one kind of metal oxide selected from the group consisting of zinc oxide (ZnO), titanium oxide ($TiO_2$), magnesium zinc oxide (MgZnO), tantalum oxide ($Ta_2O_3$), and strontium titanate oxide ($SrTiO_3$). The ETL 24c may contain nanoparticles NP of the same kind of metal oxide among the sub-pixels RSP, GSP, and BSP. The ETL 24c may also contain nanoparticles NP of a different kind of metal oxide for each of the sub-pixels RSP, GSP, and BSP. In other words, the ETL 24cR, the ETL 24cG, and the ETL 24cB may contain the nanoparticles NP of the same kind of metal oxide, or of different kinds of metal oxide.

As to the nanoparticles NP of metal oxide to be used for the ETL 24c, nanoparticles of zinc oxide (hereinafter referred to as "ZnO-NP") are common, inexpensive, and readily available. Hence, ZnO-NP is preferable as the nanoparticles NP.

When the mixture of the nanoparticles NP and the binding resin BR is dissolved in a solvent, the binding resin BR may be any give resin if the nanoparticles NP in the solvent solution are high in dispersive property. Hence, the resin to be selected as the binding resin BR is the one to dissolve in an alcoholic solvent or an organic solvent to be used as the solvent. Moreover, in view of electron transporting capability of the ETL 24c, the resin to be selected does not have an electrically harmful effect.

If the light-emitting layer 24b is formed by photolithography, an organic solvent can be used as the solvent. Examples of the organic solvent include toluene, chlorobenzene, o-dichlorobenzene, phenylcyclohexane, 4-isopropylbiphenyl, and 1,1-bis(3,4-dimethylphenyl)ethane.

When the light-emitting layer 24b is formed by a technique of applying a solution of the colloidal QDs and drying the solution, an alcoholic solvent is preferably used as the solvent. This is because the alcoholic solvent leaves the QDs of the light-emitting layer 24b undissolved; whereas, the organic solvent inevitably dissolves the QDs of the light-emitting layer 24b. Examples of the alcoholic solvent include 1-butanol, isobutanol, isopropyl alcohol (IPA), n-butanol, t-butanol, and secondary butyl alcohol.

Moreover, the second electrode 25 is stacked on the ETL 24c by sputtering or vapor deposition. Hence, the resin to be selected as the binding resin BR contained in the ETL 24c is preferably resistant to damage by heat or plasma.

An example of the binding resin BR to allow the nanoparticles NP to improve in dispersive property is a resin including a side chain having at least one functional group selected from the group consisting of a lactam structure and a butyral ring. Here, the lactam structure is formed of a carboxyl group and an amino group undergoing a condensation reaction and formed into a ring. The resin having the functional group provides advantageous effects to the binding resin BR. That is, the binding resin BR is uniformly dispersive from the nanoparticles NP, well deposited, and superior in heat resistance.

Specifically, the binding resin BR can be, for example, polyvinylpyrrolidone and alkyl-acetalized polyvinyl alcohol. Polyvinylpyrrolidone is a resin whose side chain is formed of a carboxyl group and an amino group undergoing a condensation reaction and formed into a ring (a lactam structure). Alkyl-acetalized polyvinyl alcohol is a resin whose side chain is formed of a butyral ring. Here, when ZnO-NP and either polyvinylpyrrolidone or alkyl-acetalized polyvinyl alcohol are mixed together and dissolved in a solvent so that a solution is prepared, the liquid phase and the solid phase in the solution do not separate even if the solution is left for several months.

The above result shows that polyvinylpyrrolidone and alkyl-acetalized polyvinyl alcohol allow ZnO-NP to sufficiently disperse in the solvent.

Figure 5:
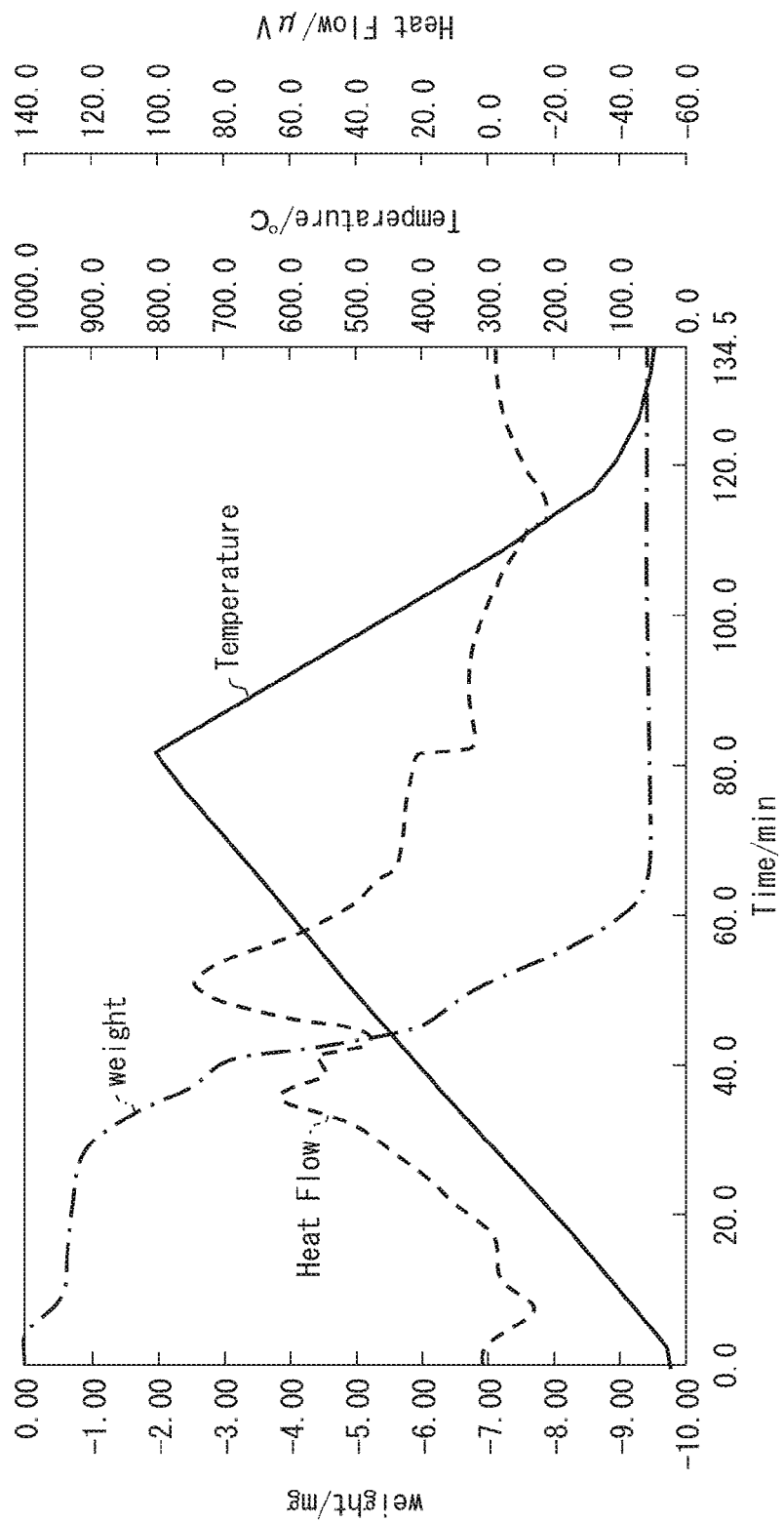
FIG. 5 illustrates a graph showing a specific example of a result of analyzing polyvinylpyrrolidone by thermogravimetry/differential thermal analysis (TG-TDA).
Figure 6:
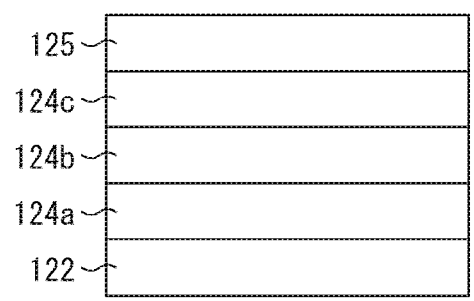
FIG. 6 illustrates a schematic diagram showing an exemplary multilayered structure of a main part of a light-emitting element of the display device according to a known technique.
Figure 7:
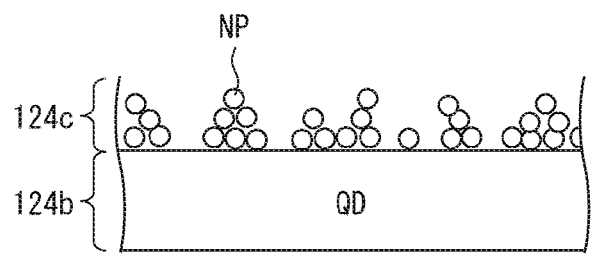
FIG. 7 illustrates a schematic diagram showing a structure of an ELT on a light-emitting layer of the display device according to the known technique.

The binding resin BR is preferably, but not limited to, a resin whose 20% weight-loss temperature is 120° C. and above when analyzed by the thermogravimetry/differential thermal analysis (TG-TDA). The TG-TDA can be used as an indicator to find that the resin is resistant to pyrolysis. For example, FIG. 5 illustrates a graph showing a specific example of a result of analyzing polyvinylpyrrolidone by the TG-TDA. FIG. 5 shows a result of an analysis, by the TG-TDA, of polyvinylpyrrolidone having a molecular weight of 40,000. Moreover, as illustrated in FIG. 5, when 9.57 mg of polyvinylpyrrolidone is heated so that the temperature of polyvinylpyrrolidone rises at 10° C./min., polyvinylpyrrolidone loses 20% of its weight at a temperature of 355° C., compared with the weight of the pre-heated sample. Note that α-aluminum is used as a reference material. Moreover, in the graph in FIG. 5, "weight" indicates a decreasing weight of the sample associated with application of heat, "temperature" indicates a temperature of the furnace, and "heat flow" indicates a flow of heat (heat capacity).

Table 1 shows a result of the TG-TDA that measures temperatures of resins when the resins lose 20% of their weights. Here, the resins are three kinds each of polyvinylpyrrolidone and alkyl-acetalized polyvinyl alcohol having different molecular weights.

TABLE 1

| Compound Name | Molecular Weight | 20% weight-loss temperature (° C.) |
|---|---|---|
| Polyvinylpyrrolidone | 10,000 | 356 |
| Polyvinylpyrrolidone | 40,000 | 355 |
| Polyvinylpyrrolidone | 360,000 | 366 |
| Alkyl-Acetalized Polyvinyl Alcohol | 17,000 | 368 |
| Alkyl-Acetalized Polyvinyl Alcohol | 19,000 | 344 |
| Alkyl-Acetalized Polyvinyl Alcohol | 23,000 | 338 |

The above result shows that polyvinylpyrrolidone and alkyl-acetalized polyvinyl alcohol in Table 1 can be determined to be sufficiently resistant to pyrolysis.

As can be seen, the solvent to be used for forming the ETL 24c is selected, depending on a technique to form the light-emitting layer 24b. Specifically, when the light-emitting layer 24b is formed by a technique of applying a solution of the colloidal QDs, an alcoholic solvent is selected as the solvent. Meanwhile, if the light-emitting layer 24b is patterned by photolithography, an organic solvent (e.g. toluene) is selected as the solvent.

Of the resins listed in Table 1, polyvinylpyrrolidone is soluble in an alcoholic solvent. Hence, if the light-emitting layer 24b is formed by the technique of applying a solution of the colloidal QDs, polyvinylpyrrolidone can be used together with the alcoholic solvent (1-butanol) to form the ETL 24c. Moreover, alkyl-acetalized polyvinyl alcohol is soluble in an organic solvent. Hence, if the light-emitting layer 24b is formed by photolithography patterning, alkyl-acetalized polyvinyl alcohol can be used together with the organic solvent (e.g. toluene) to form the ETL 24c.

When formed, the ETL 24c may further contain a dispersant dispersing the nanoparticles NP and the binding resin BR from each other. In such a case, the dispersant is, for example, an organic modifying agent OM capable of supplying electrons. The organic modifying agent OM can modify the surface of the nanoparticles NP.

The modifying agent OM is an organic dopant compound capable of providing and receiving electrons, and of supplying the electrons to the nanoparticles NP. Through the organic modifying agent OM, the nanoparticles NP receive the electrons from the second electrode 25, and release (transmit) the received electrons to the light-emitting layer 24b. Examples of the organic modifying agent OM include at least one compound selected from the group consisting of ethanolamine, 1,3-bis(carbazol-9-yl)benzene, 4,4',4"-tri(carbazol-9-yl)triphenylamine, and 4,4'-bis(carbazol-9-yl)biphenyl. The organic modifying agent OM is selected, depending on the solvent to be used for forming the ETL 24c. For example, if the solvent is an alcoholic solvent, the organic modifying agent OM to be selected is an amine-based (e.g. ethanolamine) compound. If the solvent is an organic solvent, the organic modifying agent OM to be selected is a compound (e.g. 1,3-bis(carbazol-9-yl)benzene, 4,4',4''-tri(carbazol-9-yl)triphenylamine, and 4,4'-bis(carbazol-9-yl)biphenyl) soluble to the organic solvent.

Method for Producing Display Device 1

Figure 8:
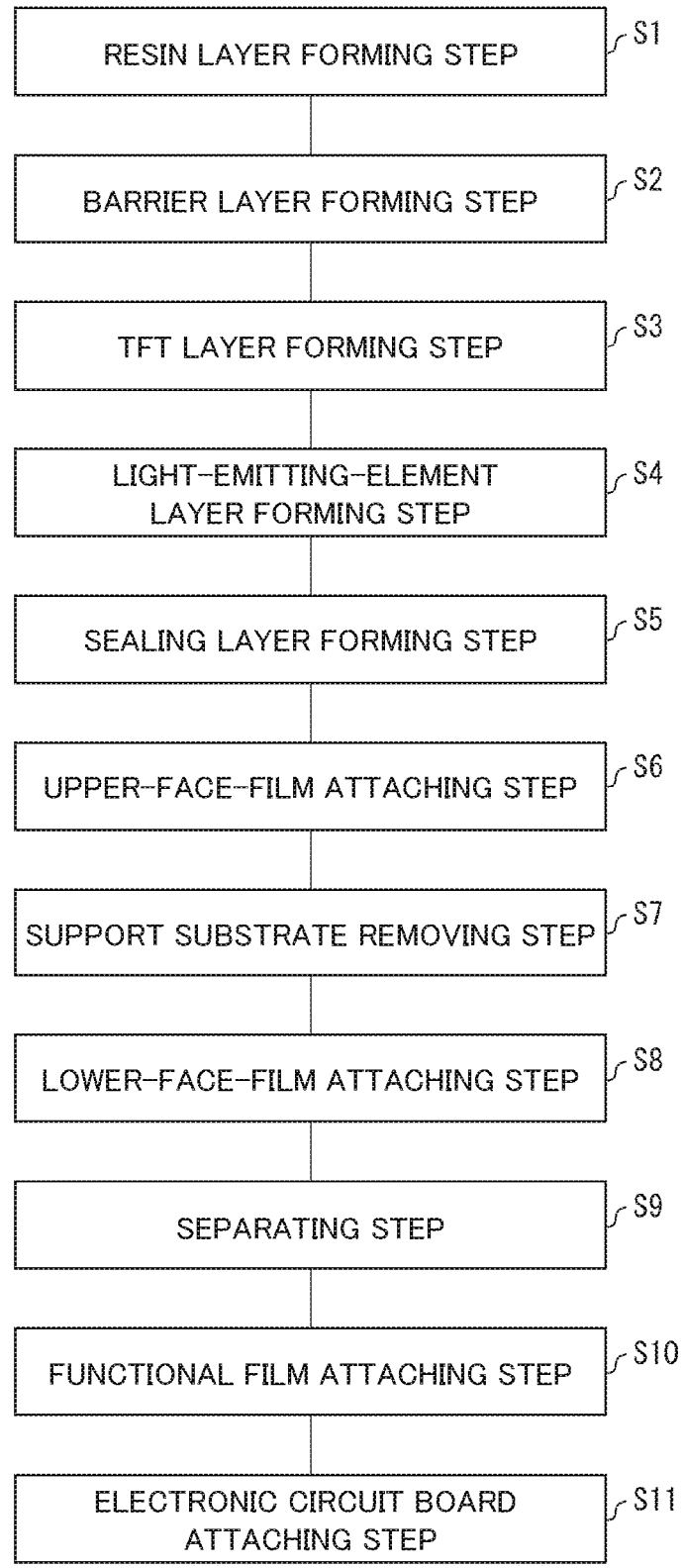
FIG. 8 illustrates a flowchart showing steps for producing the display device according to the first embodiment of the disclosure.

Described below is a method for producing the display device 1, with reference to FIG. 8. FIG. 8 illustrates a flowchart showing steps for producing the display device 1.

As illustrated in FIG. 8, the method for producing the display device 1 according to this embodiment includes, for example: a resin layer forming step (S1); a barrier layer forming step (S2); a TFT layer forming step (S3); a light-emitting-element layer forming step (S4); a sealing layer forming step (S5); an upper-face-film attaching step (S6); a support substrate removing step (S7); a lower-face-film attaching step (S8); a separating step (S9); a functional film attaching step (S10); and an electronic circuit board attaching step (S11). In this embodiment, as an example, the production of the display device 1 proceeds in the order of the above steps. Note that a step number is shown in each of the parentheses.

Note that, the order of the steps shall not be limited to the above one as long as the display device 1 having the multilayer structure illustrated in FIGS. 1 and 2 can be produced in this embodiment.

The above steps will be described below.

In producing the flexible display device 1, first, the resin layer 12 is formed on a not-shown transparent support substrate (e.g. a mother glass). Next, as illustrated in FIG. 2, the barrier layer 3, the TFT layer 4, the light-emitting-element layer 5, and the sealing layer 6 are formed on the resin layer 12 in the stated order. After that, an upper-face film is attached on the sealing layer 6. Next, the support substrate is removed from the resin layer 12 with, for example, a laser beam emitted on the support substrate. On the lower face of the resin layer 12, the lower-face film 10 is attached. After that, a multilayer stack including the lower-face film 10, the resin layer 12, the inorganic barrier layer 3, the TFT layer 4, the light-emitting device layer 5, and the sealing layer 6 is separated into a plurality of pieces. Next, to each of the obtained pieces, a functional film is attached. After that, an electronic circuit board (e.g. COF or FPC) is mounted on a part outside (a non-display area, namely, a frame) a display area in which a plurality of sub-pixels are formed. This is how the display device 1 is produced.

Figure 9:
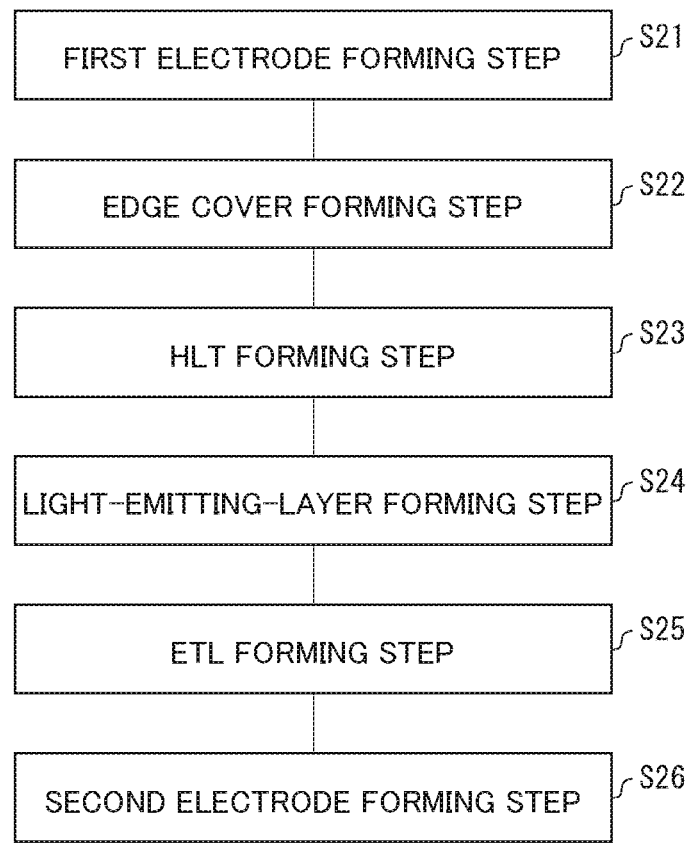
FIG. 9 illustrates a flowchart showing steps for producing a light-emitting-element layer according to the first embodiment of the disclosure.

Light-Emission-Element Layer Forming Step Here, the above light-emission-element layer forming step (S4) will be described in detail, with reference to FIG. 9. FIG. 9 illustrates a flowchart showing steps for producing the light-emitting-element layer 5.

In the method for producing the display device 1 according to this embodiment, the light-emission-element layer forming step (S4) includes, as illustrated in FIG. 9, for example: a first electrode forming step (S21); an edge cover forming step (S22); an HLT forming step (S23); a light-emitting-layer forming step (S24); an ETL forming step (S25); and a second electrode forming step (S26). In this embodiment, as an example, the light-emission-element layer forming step (S4) proceeds in the order of the above steps.

Note that, the order of the steps shall not be limited to the above one as long as the light-emitting-element layer having the multilayer structure illustrated in FIG. 3 can be produced in this embodiment.

ETL Forming Step

Figure 10:
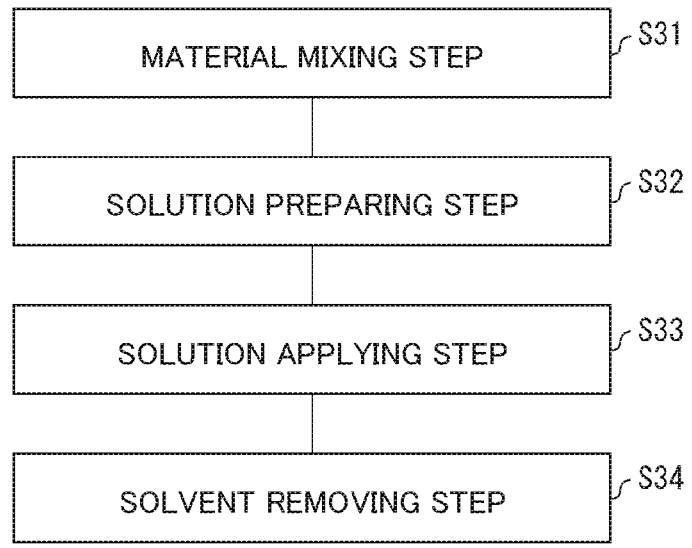
FIG. 10 illustrates a flowchart showing steps for producing the ETL according to the first embodiment of the disclosure.

Moreover, the above ETL forming step (S25) will be described in detail, with reference to FIG. 10. FIG. 10 illustrates a flowchart showing steps for producing the ETL 24c.

In the method for producing the display device according to this embodiment, the above ETL forming step (S25) includes, for example: a material mixing step (S31); a solution preparing step (S32); a solution applying step (S33); and a solvent removing step (S34). In this embodiment, as an example, the ETL forming step (S25) proceeds in the order of the above steps.

As to the above steps, in this embodiment, the ETL 24c is formed by a technique including (i) mixing the nanoparticles NP and the binding resin BR, (ii) dissolving the mixture of the nanoparticles NP and the biding resin BR in a solvent to prepare a solution, (iii) applying the solution to the light-emitting layer 24b with a spin coater, and (iv) drying the solution to remove the solvent and depositing the ETL 24c.

Note that, the order of the steps shall not be limited to the above one as long as the ETL having the structure illustrated in FIG. 4 can be produced in this embodiment.

For example, the nanoparticles NP and the binding resin BR are mixed together. Added to the mixture is a solvent in which the organic modifying agent OM is dissolved. Thus, a solution is prepared to include the binding resin BR and the nanoparticles NP, of metal oxide, whose surface is modified with the organic modifying agent OM. Next, the solution is applied to the light-emitting layer 24b with, for example, a spin coater. After that, the solution may be dried and the solvent may be removed to form the ETL.

Modification

In the above embodiment, described as an example is the case where the light-emitting element is a QLED. However, the embodiment shall not be limited to such a case. The light-emitting element may be, for example, an organic light-emitting diode (OLED).

Moreover, in this embodiment, described as examples are cases where multiple kinds of quantum dots are a combination of red QDs, green QDs, and blue QDs, and where the display device 1 includes the sub-pixels RSP, the sub-pixels GSP, and the sub-pixels BSP as the sub-pixels. However, the combination shall not be limited to these combinations.

Furthermore, in this embodiment, described as an example is a case where the light-emitting element includes the HTL 24a, the light-emitting layer 24b, and the ETL 24c provided between the first electrode 22 and the second electrode 25, serving as functional layers, and stacked in the stated order from toward the first electrode 22. However, the combination of the functional layers shall not be limited to the above combination as long as: the functional layers include the light-emitting layer 24b; and the ETL 24c is provided between the second electrode 25 and the light-emitting layer. Another functional layer than the above functional layers may be included. For example, an electron-injection layer (EIL) may further be provided between the second electrode 25 and the ETL 24c.

The disclosure shall not be limited to the embodiment described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in the embodiment may be combined to achieve a new technical feature.

EXAMPLES

As to the six binding resins BR listed in Table 1, a deposition of the ETL 24c, a film condition and a transmittance of the second electrode, and an external quantum efficiency of the display device 1 were evaluated while each biding resin BR was added in various amounts.

In tables of Examples, the volume ratio in the ETL 24c means a volume ratio of the nanoparticles NP to the binding resin BR observed of the ETL 24c formed by applying a solvent solution containing the nanoparticles NP, the binding resin BR, and a dispersant, and by removing the solvent. The external quantum efficiency is a ratio of a quantity of photons to be emitted out of the light-emitting element to a quantity of electrons to be injected in the light-emitting layer 24b.

Moreover, in tables of Examples, "Excellent" denotes that the evaluation result is very good, "Good" denotes that the evaluation result is good, "Rather Poor" denotes that the evaluation result is a little bit poor, and "Poor" denotes that the evaluation result is poor.

A stylus profiler was used to evaluate the deposition of the ETL 24c and the film condition of the second electrode. As a reference of the evaluation in relation to a target film thickness of 60 nm, "Excellent" means that a margin of error of a film thickness of the film is plus or minus 0.5 nm. "Good" means that the margin of error is plus or minus 2.0 nm. "Rather Poor" means that the margin of error is plus or minus 8.0 nm. "Poor" means that the margin of error is greater than plus or minus 8.0 nm.

A spectrophotometer was used to evaluate a transmittance of the second electrode. A reference of evaluation is a proportion of an incident light of 600 nm passing through a film. "Excellent" means that the proportion is 90% or higher. "Good" means that the proportion is 85% or higher. "Rather Poor" means that the proportion is 80% or higher. "Poor" means that the proportion is lower than 80%.

Example 1

Used in Example 1 were: zinc oxide nanoparticles (ZnO-NP) as the nanoparticles NP of metal oxide; polyvinylpyrrolidone having a molecular weight of 10,000 as the binding resin BR; ethanolamine as the dispersant; and 1-butanol as the solvent.

First, a solution was prepared for forming each ETL 24c at the ratios listed in Table 2 below. A sample No. 1-1 was a reference sample with no binding resin BR contained.

TABLE 2

| No. | Metal Oxide [pts. wt] | Resin [pts. wt] | Dispersant [pts. wt] | Solvent [pts. wt] |
| --- | --- | --- | --- | --- |
| 1-1 | — | | 0.5 | 94.50 |
| 1-2 | 5 | 0.056 | 0.5 | 94.44 |
| 1-3 | 5 | 0.119 | 0.5 | 94.38 |
| 1-4 | 5 | 0.267 | 0.5 | 94.23 |
| 1-5 | 5 | 0.459 | 0.5 | 194.04 |
| 1-6 | 5 | 0.714 | 0.5 | 193.78 |
| 1-7 | 5 | 1.071 | 0.5 | 193.42 |
| 1-8 | 5 | 1.607 | 0.5 | 192.89 |
| 1-9 | 5 | 2.5 | 0.5 | 192.00 |

Table 3 below shows the evaluations of the light-emitting elements formed using the solutions prepared as seen in Table 2.

TABLE 3

| | Volume Ratio in ETL | | | Second Electrode | | External Quantum |
| --- | --- | --- | --- | --- | --- | --- |
| No. | ZnO NP | Resin | Deposition | Film Condition | Transmittance | Efficiency (EQE) [%] |
| 1-1 | 100 | — | Rather Poor | Poor (Delamination Found) | Poor | 5.4 |
| 1-2 | 95 | 5 | Good | Good | Very Good | 5.7 |
| 1-3 | 90 | 10 | Good | Good | Very Good | 6.2 |
| 1-4 | 80 | 20 | Very Good | Very Good | Very Good | 6.7 |
| 1-5 | 70 | 30 | Very Good | Very Good | Very Good | 7.1 |
| 1-6 | 60 | 40 | Very Good | Very Good | Very Good | 6.9 |
| 1-7 | 50 | 50 | Very Good | Very Good | Very Good | 6.2 |
| 1-8 | 40 | 60 | Very Good | Very Good | Very Good | 5.1 |
| 1-9 | 30 | 70 | Very Good | Very Good | Good | 4.6 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Example 2

Used in Example 2 were: ZnO-NP as the nanoparticles NP of metal oxide; polyvinylpyrrolidone having a molecular weight of 40,000 as the binding resin BR; ethanolamine as the dispersant; and 1-butanol as the solvent.

First, a solution was prepared for forming each ETL 24c at the ratios listed in Table 4 below. A sample No. 2-1 was a reference sample with no binding resin BR contained.

TABLE 4

| No. | Metal Oxide [pts. wt] | Resin [pts. wt] | Dispersant [pts. wt] | Solvent [pts. wt] |
| --- | --- | --- | --- | --- |
| 2-1 | | — | 0.5 | 94.50 |
| 2-2 | 5 | 0.056 | 0.5 | 94.44 |
| 2-3 | 5 | 0.119 | 0.5 | 94.38 |
| 2-4 | 5 | 0.267 | 0.5 | 94.23 |
| 2-5 | 5 | 0.459 | 0.5 | 194.04 |
| 2-6 | 5 | 0.714 | 0.5 | 193.78 |
| 2-7 | 5 | 1.071 | 0.5 | 193.42 |
| 2-8 | 5 | 1.607 | 0.5 | 192.89 |
| 2-9 | 5 | 2.5 | 0.5 | 192.00 |

Table 5 below shows the evaluations of the light-emitting elements formed using the solutions prepared as seen in Table 4.

TABLE 5

| | Volume Ratio in ETL | | | Second Electrode | | External Quantum |
| --- | --- | --- | --- | --- | --- | --- |
| No. | ZnO NP | Resin | Deposition | Film Condition | Transmittance | Efficiency (EQE) [%] |
| 2-1 | 100 | — | Rather Poor | Poor (Delamination Found) | Poor | 5.5 |

TABLE 5-continued

| | | | | | External |
|---|---|---|---|---|---|
| | Volume Ratio in ETL | | | Second Electrode | Quantum |
| No. | ZnO NP | Resin | Deposition | Film Condition | Transmittance | Efficiency (EQE) [%] |
|---|---|---|---|---|---|---|
| 2-2 | 95 | 5 | Good | Good | Very Good | 5.8 |
| 2-3 | 90 | 10 | Good | Good | Very Good | 6.4 |
| 2-4 | 80 | 20 | Very Good | Very Good | Very Good | 6.9 |
| 2-5 | 70 | 30 | Very Good | Very Good | Very Good | 7.3 |
| 2-6 | 60 | 40 | Very Good | Very Good | Very Good | 7.2 |
| 2-7 | 50 | 50 | Very Good | Very Good | Very Good | 6.4 |
| 2-8 | 40 | 60 | Very Good | Very Good | Very Good | 5.3 |
| 2-9 | 30 | 70 | Very Good | Very Good | Good | 4.7 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Example 3

Used in Example 3 were: ZnO-NP as the nanoparticles NP of metal oxide; polyvinylpyrrolidone having a molecular weight of 360,000 as the binding resin BR; ethanolamine as the dispersant; and 1-butanol as the solvent.

First, a solution was prepared for forming each ETL 24c at the ratios listed in Table 6 below. A sample No. 3-1 was a reference sample with no binding resin BR contained.

TABLE 6

| No. | Metal Oxide [pts. wt] | Resin [pts. wt] | Dispersant [pts. wt] | Solvent [pts. wt] |
|---|---|---|---|---|
| 3-1 | — | — | 0.5 | 94.50 |
| 3-2 | 5 | 0.056 | 0.5 | 94.44 |
| 3-3 | 5 | 0.119 | 0.5 | 94.38 |
| 3-4 | 5 | 0.267 | 0.5 | 94.23 |
| 3-5 | 5 | 0.459 | 0.5 | 194.04 |
| 3-6 | 5 | 0.714 | 0.5 | 193.78 |
| 3-7 | 5 | 1.071 | 0.5 | 193.42 |
| 3-8 | 5 | 1.607 | 0.5 | 192.89 |
| 3-9 | 5 | 2.5 | 0.5 | 192.00 |

Table 7 below shows the evaluations of the light-emitting elements formed using the solutions prepared as seen in Table 6.

TABLE 7

| | | | | | External |
|---|---|---|---|---|---|
| | Volume Ratio in ETL | | | Second Electrode | Quantum |
| No. | ZnO NP | Resin | Deposition | Film Condition | Transmittance | Efficiency (EQE) [%] |
|---|---|---|---|---|---|---|
| 3-1 | 100 | — | Rather Poor | Poor (Delamination Found) | Poor | 5.3 |
| 3-2 | 95 | 5 | Good | Good | Very Good | 5.6 |
| 3-3 | 90 | 10 | Good | Good | Very Good | 6.1 |
| 3-4 | 80 | 20 | Very Good | Very Good | Very Good | 6.5 |
| 3-5 | 70 | 30 | Very Good | Very Good | Very Good | 6.9 |
| 3-6 | 60 | 40 | Very Good | Very Good | Very Good | 6.7 |
| 3-7 | 50 | 50 | Very Good | Very Good | Very Good | 6.3 |
| 3-8 | 40 | 60 | Very Good | Very Good | Very Good | 5.2 |
| 3-9 | 30 | 70 | Very Good | Very Good | Good | 4.7 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Example 4

Used in Example 4 were: ZnO-NP as the nanoparticles NP of metal oxide; alkyl-acetalized polyvinyl alcohol having a molecular weight of 17,000 as the binding resin BR; 1,3-bis(carbazol-9-yl)benzene as the dispersant; and toluene as the solvent.

First, a solution was prepared for forming each ETL 24c at the ratios listed in Table 8 below. A sample No. 4-1 was a reference sample with no binding resin BR contained.

TABLE 8

| No. | Metal Oxide [pts. wt] | Resin [pts. wt] | Dispersant [pts. wt] | Solvent [pts. wt] |
|---|---|---|---|---|
| 4-1 | — | — | 0.5 | 94.50 |
| 4-2 | 5 | 0.056 | 0.5 | 94.44 |
| 4-3 | 5 | 0.119 | 0.5 | 94.38 |
| 4-4 | 5 | 0.267 | 0.5 | 94.23 |
| 4-5 | 5 | 0.459 | 0.5 | 194.04 |
| 4-6 | 5 | 0.714 | 0.5 | 193.78 |
| 4-7 | 5 | 1.071 | 0.5 | 193.42 |
| 4-8 | 5 | 1.607 | 0.5 | 192.89 |
| 4-9 | 5 | 2.5 | 0.5 | 192.00 |

Table 9 below shows the evaluations of the light-emitting elements formed using the solutions prepared as seen in Table 8.

TABLE 9

| | | | | | External |
|---|---|---|---|---|---|
| | Volume Ratio in ETL | | | Second Electrode | Quantum |
| No. | ZnO NP | Resin | Deposition | Film Condition | Transmittance | Efficiency (EQE) [%] |
|---|---|---|---|---|---|---|
| 4-1 | 100 | — | Rather Poor | Poor (Delamination Found) | Poor | 5.2 |
| 4-2 | 95 | 5 | Good | Good | Very Good | 5.7 |
| 4-3 | 90 | 10 | Good | Good | Very Good | 6.2 |
| 4-4 | 80 | 20 | Very Good | Very Good | Very Good | 6.6 |
| 4-5 | 70 | 30 | Very Good | Very Good | Very Good | 7.0 |
| 4-6 | 60 | 40 | Very Good | Very Good | Very Good | 6.8 |
| 4-7 | 50 | 50 | Very Good | Very Good | Very Good | 6.3 |

TABLE 9-continued

| | ETL | | | | External |
|---|---|---|---|---|---|
| | Volume Ratio in ETL | | | Second Electrode | | Quantum |
| No. | ZnO NP | Resin | De-position | Film Condition | Trans-mittance | Efficiency (EQE) [%] |
| 4-8 | 40 | 60 | Very Good | Very Good | Very Good | 5.2 |
| 4-9 | 30 | 70 | Very Good | Very Good | Good | 4.8 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Example 5

Used in Example 5 were: ZnO-NP as the nanoparticles NP of metal oxide; alkyl-acetalized polyvinyl alcohol having a molecular weight of 19,000 as the binding resin BR; 1,3-bis(carbazol-9-yl)benzene as the dispersant; and toluene as the solvent.

First, a solution was prepared for forming each ETL 24c at the ratios listed in Table 10 below. A sample No. 5-1 was a reference sample with no binding resin BR contained.

TABLE 10

| No. | Metal Oxide [pts. wt] | Resin [pts. wt] | Dispersant [pts. wt] | Solvent [pts. wt] |
|---|---|---|---|---|
| 5-1 | — | — | 0.5 | 94.50 |
| 5-2 | 5 | 0.056 | 0.5 | 94.44 |
| 5-3 | 5 | 0.119 | 0.5 | 94.38 |
| 5-4 | 5 | 0.267 | 0.5 | 94.23 |
| 5-5 | 5 | 0.459 | 0.5 | 194.04 |
| 5-6 | 5 | 0.714 | 0.5 | 193.78 |
| 5-7 | 5 | 1.071 | 0.5 | 193.42 |
| 5-8 | 5 | 1.607 | 0.5 | 192.89 |
| 5-9 | 5 | 2.5 | 0.5 | 192.00 |

Table 11 below shows the evaluations of the light-emitting elements formed using the solutions prepared as seen in Table 10.

TABLE 11

| | ETL | | | | External |
|---|---|---|---|---|---|
| | Volume Ratio in ETL | | | Second Electrode | | Quantum |
| No. | ZnO NP | Resin | De-position | Film Condition | Trans-mittance | Efficiency (EQE) [%] |
| 5-1 | 100 | — | Rather Poor | Poor (Delamination Found) | Poor | 5.5 |
| 5-2 | 95 | 5 | Good | Good | Very Good | 5.6 |
| 5-3 | 90 | 10 | Good | Good | Very Good | 6.3 |
| 5-4 | 80 | 20 | Very Good | Very Good | Very Good | 6.8 |
| 5-5 | 70 | 30 | Very Good | Very Good | Very Good | 7.3 |
| 5-6 | 60 | 40 | Very Good | Very Good | Very Good | 6.8 |
| 5-7 | 50 | 50 | Very Good | Very Good | Very Good | 6.3 |
| 5-8 | 40 | 60 | Very Good | Very Good | Very Good | 5.2 |
| 5-9 | 30 | 70 | Very Good | Very Good | Good | 4.5 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Example 6

Used in Example 6 were: ZnO-NP as the nanoparticles NP of metal oxide; alkyl-acetalized polyvinyl alcohol having a molecular weight of 23,000 as the binding resin BR; 1,3-bis(carbazol-9-yl)benzene as the dispersant; and toluene as the solvent.

First, a solution was prepared for forming each ETL 24c at the ratios listed in Table 12 below. A sample No. 6-1 was a reference sample with no binding resin BR contained.

TABLE 12

| No. | Metal Oxide [pts. wt] | Resin [pts. wt] | Dispersant [pts. wt] | Solvent [pts. wt] |
|---|---|---|---|---|
| 6-1 | — | — | 0.5 | 94.50 |
| 6-2 | 5 | 0.056 | 0.5 | 94.44 |
| 6-3 | 5 | 0.119 | 0.5 | 94.38 |
| 6-4 | 5 | 0.267 | 0.5 | 94.23 |
| 6-5 | 5 | 0.459 | 0.5 | 194.04 |
| 6-6 | 5 | 0.714 | 0.5 | 193.78 |
| 6-7 | 5 | 1.071 | 0.5 | 193.42 |
| 6-8 | 5 | 1.607 | 0.5 | 192.89 |
| 6-9 | 5 | 2.5 | 0.5 | 192.00 |

Table 13 below shows the evaluations of the light-emitting elements formed using the solutions prepared as seen in Table 12.

TABLE 13

| | ETL | | | | External |
|---|---|---|---|---|---|
| | Volume Ratio in ETL | | | Second Electrode | | Quantum |
| No. | ZnO NP | Resin | De-position | Film Condition | Trans-mittance | Efficiency (EQE) [%] |
| 6-1 | 100 | — | Rather Poor | Poor (Delamination Found) | Poor | 5.3 |
| 6-2 | 95 | 5 | Good | Good | Very Good | 5.8 |
| 6-3 | 90 | 10 | Good | Good | Very Good | 6.2 |
| 6-4 | 80 | 20 | Very Good | Very Good | Very Good | 6.6 |
| 6-5 | 70 | 30 | Very Good | Very Good | Very Good | 7.0 |
| 6-6 | 60 | 40 | Very Good | Very Good | Very Good | 6.9 |
| 6-7 | 50 | 50 | Very Good | Very Good | Very Good | 6.0 |
| 6-8 | 40 | 60 | Very Good | Very Good | Very Good | 5.1 |
| 6-9 | 30 | 70 | Very Good | Very Good | Good | 4.7 |

The above results show that all the items are "Excellent" when the volume ratio of ZnO-NP to the binding resin BR ranges from 80:20 to 40:60. Moreover, when the volume ratio ranges from 95:5 to 40:60, all the items show the results of "Good" or better (either "Excellent" or "Good").

Summary

The display device 1 according to a first aspect of the disclosure includes: the display region DA having a plurality of pixels; and the frame region NA. The display region DA includes: the thin-film transistor layer 4; the light-emitting-element layer 5 provided above the thin-film transistor layer 4; and the sealing layer 6 provided above the light-emitting-element layer 5. The light-emitting-element layer 5 includes: the first electrode 22; the second electrode 25; the light-emitting layer 24b provided between the first electrode 22 and the second electrode 25; and the ETL 24c provided between the light-emitting layer 24b and the second electrode 25. The ETL 24c contains: nanoparticles NP of metal oxide; and the binding resin BR.

Thanks to above configuration, the ETL 24c can be higher in dispersive property of the nanoparticles NP of metal oxide than a known ETL is. The display device provided with such a feature can emit light more evenly and efficiently than a known display device does.

More specifically, the above configuration can improve the dispersive property of the nanoparticles NP. When the dispersive property of the nanoparticles NP improves, the ETL 24c is made more planar. The improvement in planarity contributes to uniformity in emission of light. Moreover, when the dispersive property of the nanoparticles NP improves, the nanoparticles NP are equally distanced from one another. At the same time, the binding resin BR flows in the spacing between the nanoparticles NP. Such features make it possible to provide the ETL 24c with a denser structure. The ETL 24c with the denser structure improves in a barrier effect against heat and plasma developed in the vapor deposition step and the sputtering step in depositing the second electrode 25. The improvement in the barrier effect can reduce damage to the light-emitting layer 24b, curb decrease in luminance of emitting light, and improve light emission efficiency.

In the display device according to a second aspect of the disclosure, the binding resin BR incudes a side chain having at least one functional group selected from the group consisting of a compound (a lactam structure) and a butyral ring. Here, the compound is formed of a carboxyl group and an amino group undergoing a condensation reaction and formed into a ring.

The above configuration can improve the dispersive property of the nanoparticles NP in the ETL 24c.

In the display device 1 according to a third embodiment of the disclosure, the ETL 24c further contains a dispersant dispersing the nanoparticles NP and the binding resin BR from each other.

The above configuration can further improve the dispersive property of the nanoparticles NP in the ETL 24c.

In the display device 1 according to a fourth aspect of the disclosure, the dispersant is the organic modifying agent OM capable of supplying electrons.

Thanks to the above configuration, the electrons can be provided and received through the modifying agent OM, and supplied to the nanoparticles NP.

In the display device 1 according to a fifth aspect of the disclosure, the organic modifying agent OM is at least one compound selected from the group consisting of ethanolamine, 1,3-bis(carbazol-9-yl)benzene, 4,4',4''-tri(carbazol-9-yl)triphenylamine, and 4,4'-bis(carbazol-9-yl)biphenyl.

The above configuration can further improve the dispersive property of the nanoparticles NP in the ETL 24c.

In the display device 1 according to a sixth aspect of the disclosure, the nanoparticles are ZnO, and the binding resin BR is polyvinylpyrrolidone.

The above configuration can further improve the dispersive property of ZnO.

In the display device 1 according to a seventh aspect of the disclosure, a volume ratio of the ZnO and the polyvinylpyrrolidone ranges from 95:5 to 40:60.

The above configuration can provide the display device 1 with excellent external quantum efficiency (EQE).

In the display device 1 according to an eighth embodiment of the disclosure, the ETL 24c further contains a dispersant dispersing the nanoparticles NP and the binding resin BR from each other, and the dispersant is ethanolamine.

The above configuration can improve the dispersive property of the nanoparticles NP in the ETL 24c.

In the display device 1 according to a ninth embodiment of the disclosure, the nanoparticles NP are ZnO, and the binding resin BR is alkyl-acetalized polyvinyl alcohol.

The above configuration can further improve the dispersive property of ZnO.

In the display device 1 according to a tenth aspect of the disclosure, a volume ratio of the ZnO and the alkyl-acetalized polyvinyl alcohol ranges from 95:5 to 40:60.

The above configuration can provide the display device 1 with excellent external quantum efficiency (EQE).

In the display device 1 according to an eleventh aspect of the disclosure, the ETL 24c further contains a dispersant dispersing the nanoparticles NP and the binding resin BR from each other, and the dispersant is at least one compound selected from the group consisting of 1,3-bis(carbazol-9-yl) benzene, 4,4',4''-tri(carbazol-9-yl)triphenylamine, and 4,4'-bis(carbazol-9-yl)biphenyl.

The above configuration can improve the dispersive property of the nanoparticles NP in the ETL 24c.

In the display device 1 according to a twelfth aspect of the disclosure, the light-emitting element layer 5 is formed for each of the pixels. The light-emitting-element layer 5 includes the light-emitting layer 24b emitting light in red, green, and blue.

Thanks to the above configuration, intensity of light to be emitted from the pixels is adjusted so that the light can be provided with various colors.

In the display device 1 according to a thirteenth aspect of the disclosure, the light-emitting layer 24b is a quantum-dot layer.

The above configuration can provide a QLED display capable of emitting light uniformly and of reducing the risk of decrease in luminance of the emitted light.

In the display device 1 according to a fourteenth aspect of the disclosure, the light-emitting layer 24b is an organic layer.

The above configuration can provide an OLED display capable of emitting light uniformly and of reducing the risk of decrease in luminance of the emitted light.

The display device 1 includes: the display region DA having a plurality of pixels; and the frame region NA. The display region DA includes: the thin-film transistor layer 4; the light-emitting-element layer 5 provided above the thin-film transistor layer 4; and the sealing layer 6 provided above the light-emitting-element layer 5. The light-emitting-element layer 5 includes: the first electrode 22; the second electrode 25; the light-emitting layer 24b provided between the first electrode 22 and the second electrode 25; and the ETL 24c provided between the light-emitting layer 24b and the second electrode 25. A method for producing the display device 1 includes: forming the ETL 24c on the light-emitting layer 24b. The forming of the ETL 24c includes: dissolving the nanoparticles NP and the binding resin BR in a solvent to prepare a solution, applying the solution to an upper face of the light-emitting layer 24b, and, after that, removing the solvent.

The above configuration makes it possible to produce a display device capable of emitting light uniformly and of reducing the risk of decrease in luminance of the emitted light.

The invention claimed is:

1. A display device, comprising:
a display region having a plurality of pixels; and a frame region,
the display region comprising: a thin-film transistor layer; a light-emitting-element layer provided above the thin-film transistor layer; and a sealing layer provided above the light-emitting-element layer,
the light-emitting-element layer comprising: a first electrode; a second electrode; a light-emitting layer provided between the first electrode and the second electrode; and an electron-transport layer provided between the light-emitting layer and the second electrode, and
the electron-transport layer comprising a plurality of nanoparticles of a metal oxide; and a binding resin, wherein
the electron-transport layer further comprises a dispersant dispersing the plurality of nanoparticles and the binding resin from each other, and
the dispersant comprises an organic modifying agent capable of supplying electrons.

2. The display device according to claim 1, wherein the binding resin comprises a side chain having at least one functional group selected from the group consisting of a lactam structure and a butyral ring.

3. The display device according to claim 1, wherein the organic modifying agent comprises at least one compound selected from the group consisting of ethanolamine, 1,3-bis(carbazol-9-yl)benzene, 4,4',4"-tri(carbazol-9-yl)triphenylamine, and 4,4'-bis(carbazol-9-yl)biphenyl.

4. The display device according to claim 1, wherein the light-emitting-element layer is formed for each of the plurality of pixels, and the light-emitting layer emits light in red, green, and blue.

5. The display device according to claim 1, wherein the light-emitting layer comprises a quantum-dot layer.

6. The display device according to claim 1, wherein the light-emitting layer comprises an organic layer.

7. A display device, comprising:
a display region having a plurality of pixels; and a frame region,
the display region comprising: a thin-film transistor layer; a light-emitting-element layer provided above the thin-film transistor layer; and a sealing layer provided above the light-emitting-element layer,
the light-emitting-element layer comprising: a first electrode; a second electrode; a light-emitting layer provided between the first electrode and the second electrode; and an electron-transport layer provided between the light-emitting layer and the second electrode, and
the electron-transport layer comprising a plurality of nanoparticles of a metal oxide; and a binding resin, wherein
the plurality of nanoparticles comprises ZnO and the binding resin comprises polyvinylpyrrolidone.

8. The display device according to claim 7, wherein a volume ratio of the ZnO and the polyvinylpyrrolidone ranges from 95:5 to 40:60.

9. The display device according to claim 8, wherein the electron-transport layer further comprises a dispersant dispersing the plurality of nanoparticles and the binding resin from each other, and
the dispersant comprises ethanolamine.

10. The display device according to claim 7, wherein the light-emitting-element layer is formed for each of the plurality of pixels, and the light-emitting layer emits light in red, green, and blue.

11. The display device according to claim 7, wherein the light-emitting layer comprises a quantum-dot layer.

12. The display device according to claim 7, wherein the light-emitting layer comprises an organic layer.

13. A display device, comprising:
a display region having a plurality of pixels; and a frame region,
the display region comprising: a thin-film transistor layer; a light-emitting-element layer provided above the thin-film transistor layer; and a sealing layer provided above the light-emitting-element layer,
the light-emitting-element layer comprising: a first electrode; a second electrode; a light-emitting layer provided between the first electrode and the second electrode; and an electron-transport layer provided between the light-emitting layer and the second electrode, and
the electron-transport layer comprising a plurality of nanoparticles of a metal oxide; and a binding resin, wherein
the plurality of nanoparticles comprises ZnO and the binding resin comprises alkyl-acetalized polyvinyl alcohol.

14. The display device according to claim 13, wherein a volume ratio of the ZnO and the alkyl-acetalized polyvinyl alcohol ranges from 95:5 to 40:60.

15. The display device according to claim 14, wherein the electron-transport layer further comprises a dispersant dispersing the plurality of nanoparticles and the binding resin from each other, and
the dispersant comprises at least one compound selected from the group consisting of 1,3-bis(carbazol-9-yl)benzene, 4,4',4"-tri(carbazol-9-yl)triphenylamine, and 4,4'-bis(carbazol-9-yl)biphenyl.

16. The display device according to claim 13, wherein the light-emitting-element layer is formed for each of the plurality of pixels, and the light-emitting layer emits light in red, green, and blue.

17. The display device according to claim 13, wherein the light-emitting layer comprises a quantum-dot layer.

18. The display device according to claim 13, wherein the light-emitting layer comprises an organic layer.

* * * * *